(12) United States Patent
Okazaki et al.

(10) Patent No.: US 7,307,006 B2
(45) Date of Patent: Dec. 11, 2007

(54) METHOD OF MANUFACTURING SEMICONDUCTOR DEVICE

(75) Inventors: Susumu Okazaki, Nara (JP); Nozomi Horikoshi, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 104 days.

(21) Appl. No.: 11/354,824

(22) Filed: Feb. 16, 2006

(65) Prior Publication Data

US 2006/0194371 A1 Aug. 31, 2006

(30) Foreign Application Priority Data

Feb. 28, 2005 (JP) ............... 2005-053103

(51) Int. Cl.
*H01L 21/30* (2006.01)

(52) U.S. Cl. ............... 438/458; 257/E21.568; 257/E21.6; 257/E21.7

(58) Field of Classification Search ........ 438/149, 438/458; 257/E21.568, E21.6, E21.7
See application file for complete search history.

(56) References Cited

U.S. PATENT DOCUMENTS

| | | | |
|---|---|---|---|
| 5,821,138 A | 10/1998 | Yamazaki et al. | |
| 5,834,327 A | 11/1998 | Yamazaki et al. | |
| 6,127,199 A | 10/2000 | Inoue et al. | |
| 6,372,608 B1 | 4/2002 | Shimoda et al. | |
| 6,645,830 B2 | 11/2003 | Shimoda et al. | |
| 6,682,963 B2 | 1/2004 | Ishikawa | |
| 6,818,530 B2 | 11/2004 | Shimoda et al. | |
| 6,881,975 B2 | 4/2005 | Anzai et al. | |
| 6,946,361 B2 | 9/2005 | Takayama et al. | |
| 6,953,735 B2 | 10/2005 | Yamazaki et al. | |
| 2002/0146893 A1 | 10/2002 | Shimoda et al. | |
| 2003/0025118 A1 | 2/2003 | Yamazaki et al. | |
| 2003/0032210 A1 | 2/2003 | Takayama et al. | |
| 2003/0047280 A1 | 3/2003 | Takayama et al. | |
| 2003/0047732 A1 | 3/2003 | Yamazaki et al. | |
| 2003/0082889 A1 | 5/2003 | Maruyama et al. | |
| 2003/0217805 A1 | 11/2003 | Takayama et al. | |
| 2003/0224582 A1 | 12/2003 | Shimoda et al. | |
| 2004/0079941 A1 | 4/2004 | Yamazaki et al. | |
| 2004/0087110 A1 | 5/2004 | Takayama et al. | |
| 2004/0129450 A1* | 7/2004 | Yamazaki et al. | ......... 174/250 |
| 2004/0129960 A1 | 7/2004 | Maruyama et al. | |

(Continued)

FOREIGN PATENT DOCUMENTS

JP 10-125929 5/1998

*Primary Examiner*—Trung Dang
(74) *Attorney, Agent, or Firm*—Eric J. Robinson; Robinson Intellectual Property Law Office, P.C.

(57) ABSTRACT

It is an object of the present invention to provide a technology to manufacture a semiconductor sheet or a semiconductor chip with a high yield using a circuit having a thin film transistor. A manufacturing method for a semiconductor device comprises: attaching a flexible base material to an element layer x times (x is an integer number of 4 or more), wherein a thickness of a base material which is attached to the element layer (y+1)th (y is an integer number of 1 or more and less than x) time is the same or smaller than that of a base material which is attached to the element layer y-th (y is an integer number of 1 or more and less than x) time.

12 Claims, 16 Drawing Sheets

U.S. PATENT DOCUMENTS

| | | |
|---|---|---|
| 2004/0130020 A1 | 7/2004 | Kuwabara et al. |
| 2004/0132265 A1 | 7/2004 | Maruyama et al. |
| 2004/0140547 A1 | 7/2004 | Yamazaki et al. |
| 2004/0169786 A1 | 9/2004 | Yamazaki et al. |
| 2004/0171262 A1 | 9/2004 | Takayama et al. |
| 2004/0232413 A1 | 11/2004 | Yamazaki et al. |
| 2004/0232459 A1 | 11/2004 | Takayama et al. |
| 2004/0238827 A1 | 12/2004 | Takayama et al. |
| 2004/0239827 A1 | 12/2004 | Yamazaki et al. |
| 2004/0256618 A1 | 12/2004 | Imai et al. |
| 2005/0090075 A1 | 4/2005 | Takayama et al. |
| 2005/0112805 A1 | 5/2005 | Goto et al. |
| 2005/0130391 A1 | 6/2005 | Takayama et al. |
| 2005/0148121 A1 | 7/2005 | Yamazaki et al. |
| 2005/0168339 A1* | 8/2005 | Arai et al. ............... 340/572.8 |
| 2005/0214984 A1 | 9/2005 | Maruyama et al. |
| 2006/0079039 A1* | 4/2006 | Ohtani et al. ............... 438/164 |

* cited by examiner

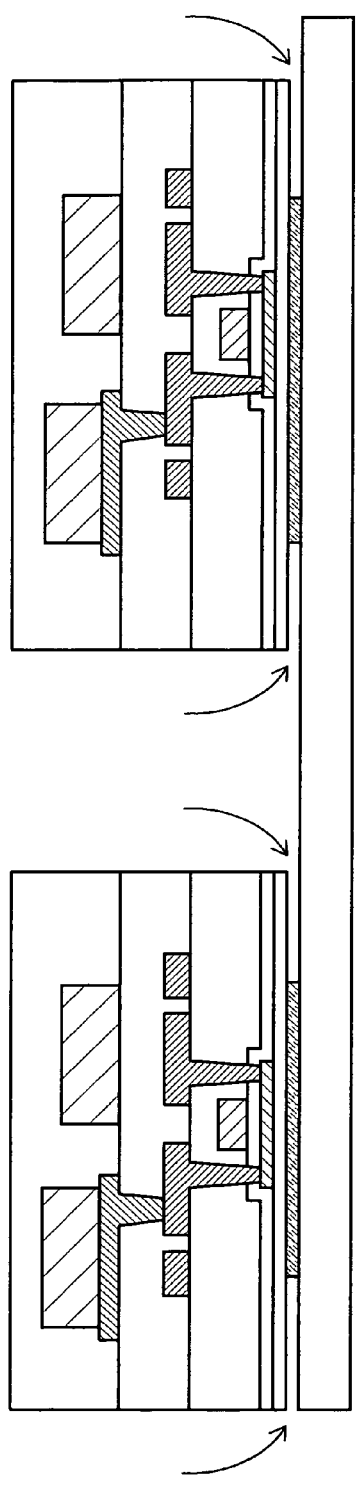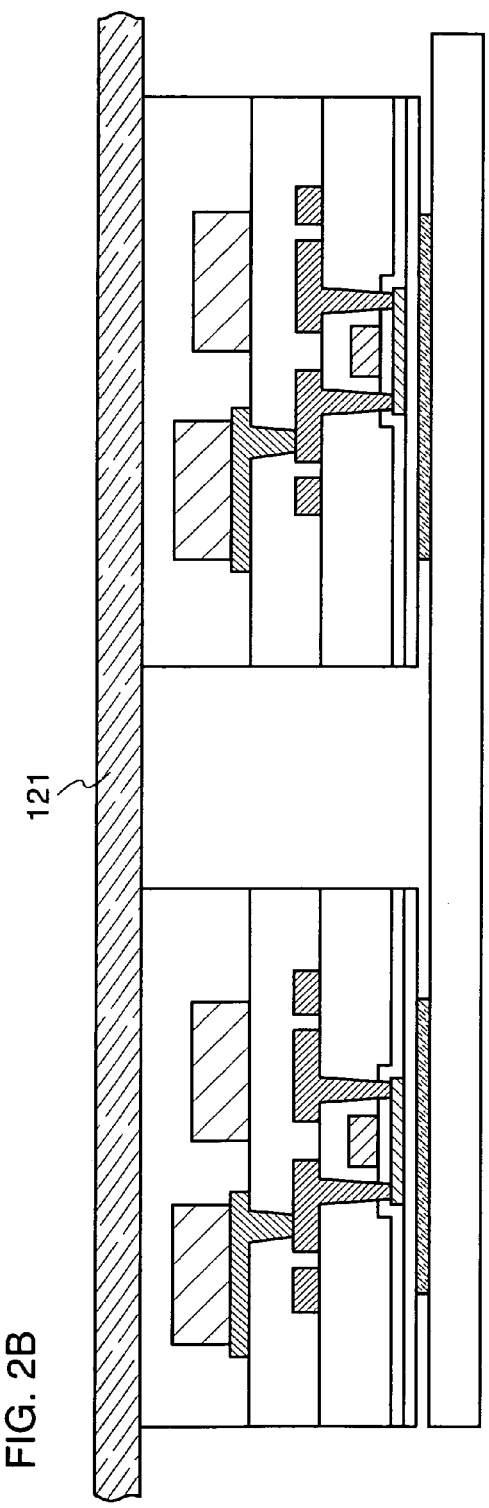

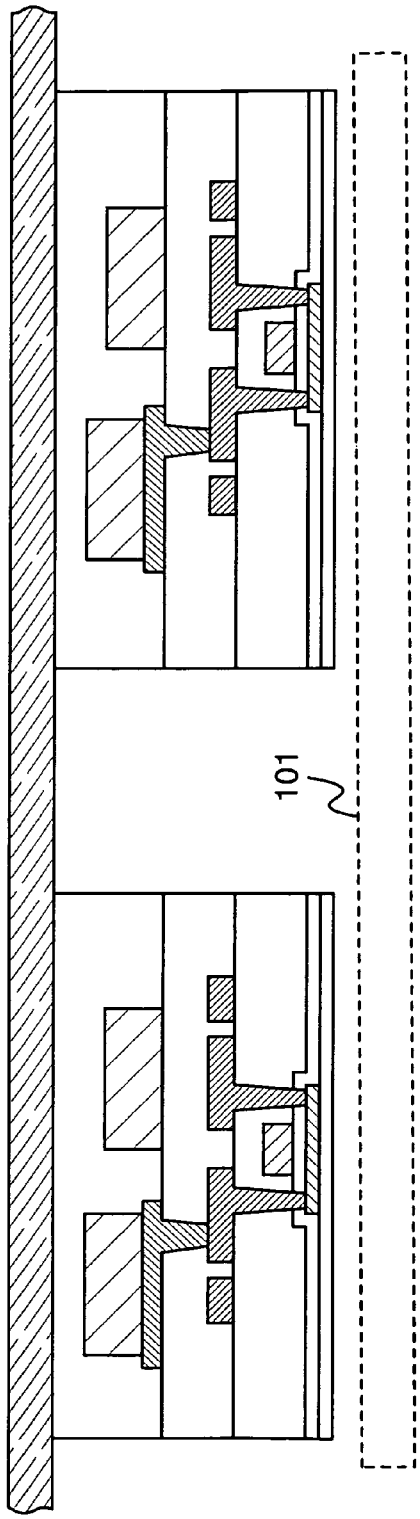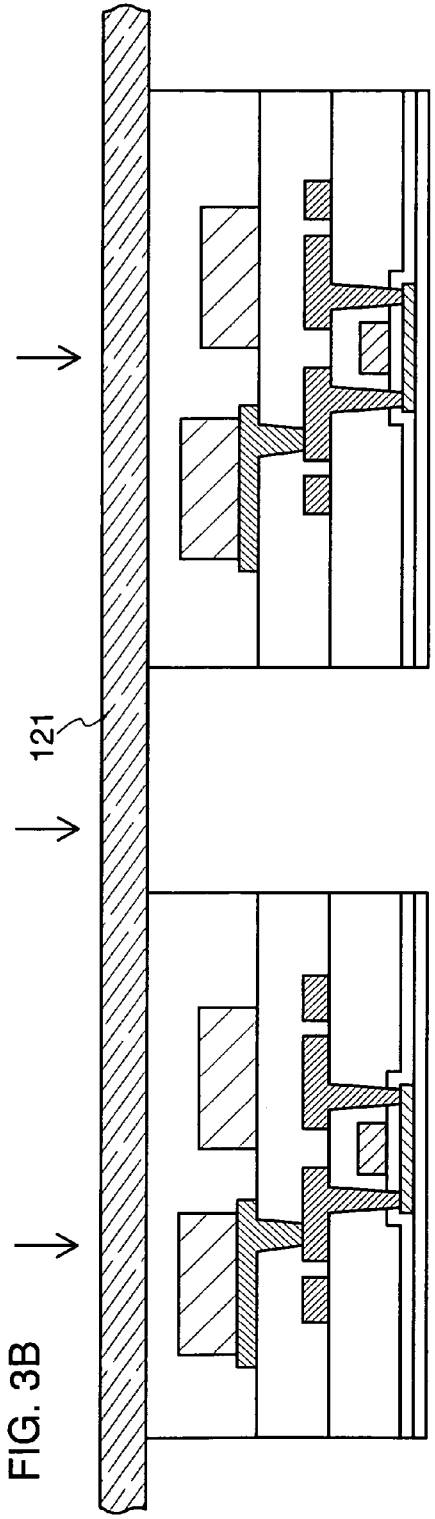

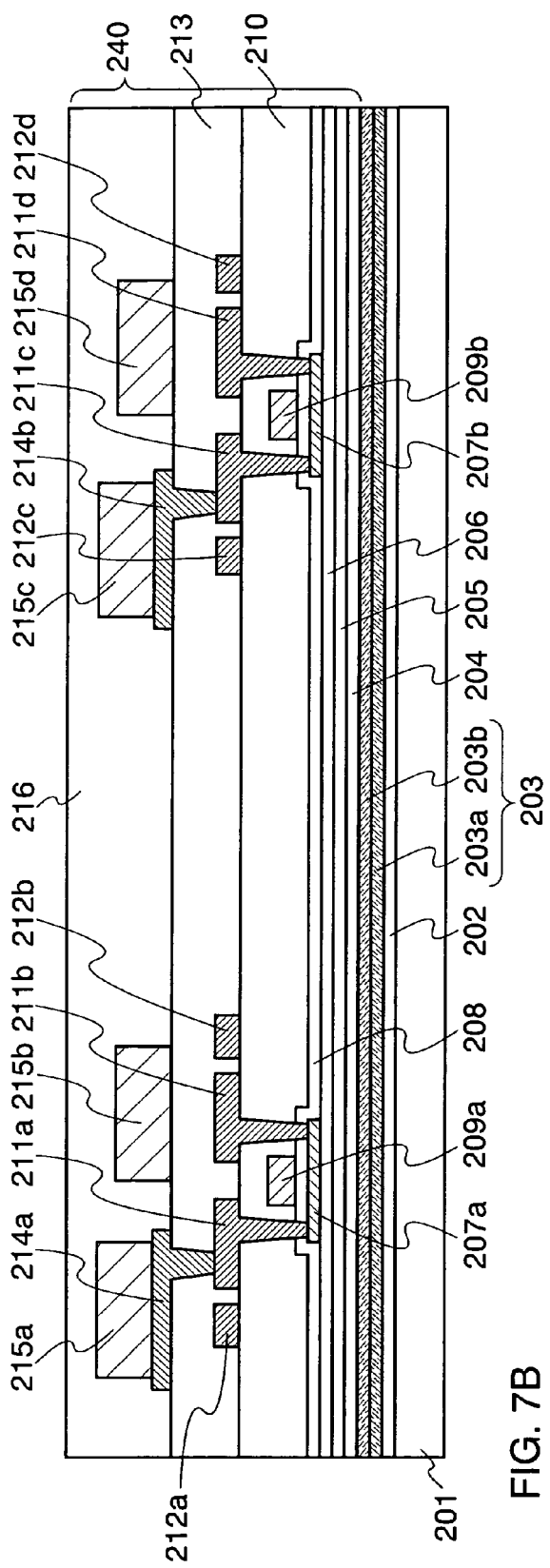

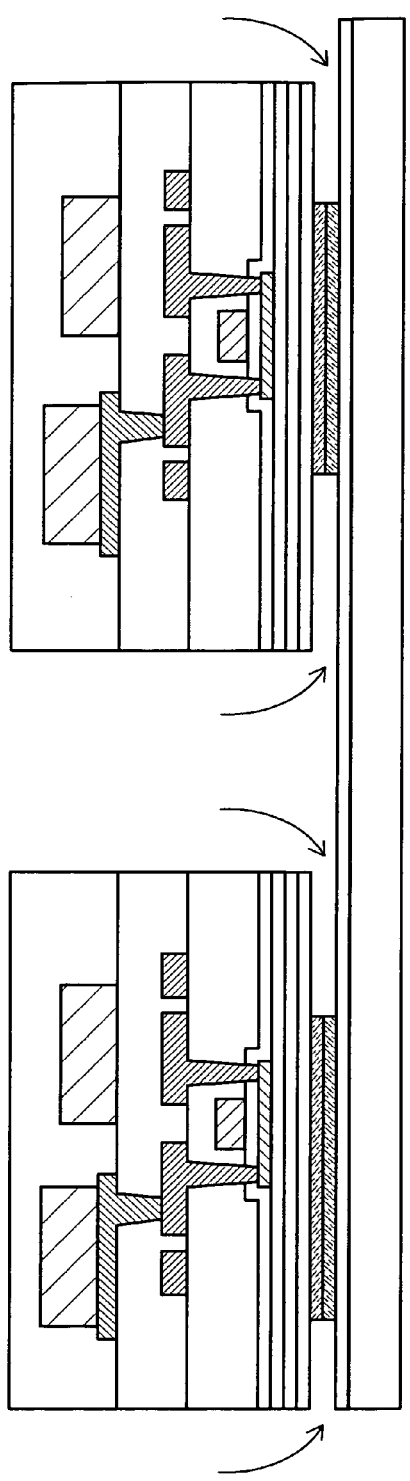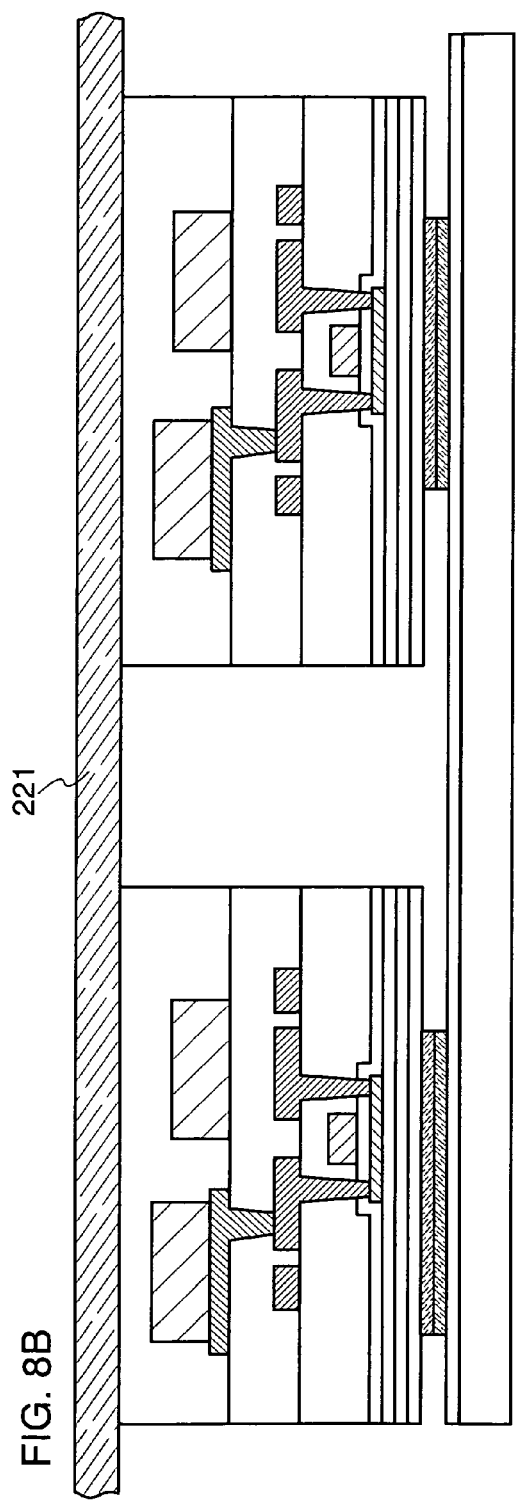
FIG. 8A
FIG. 8B
221

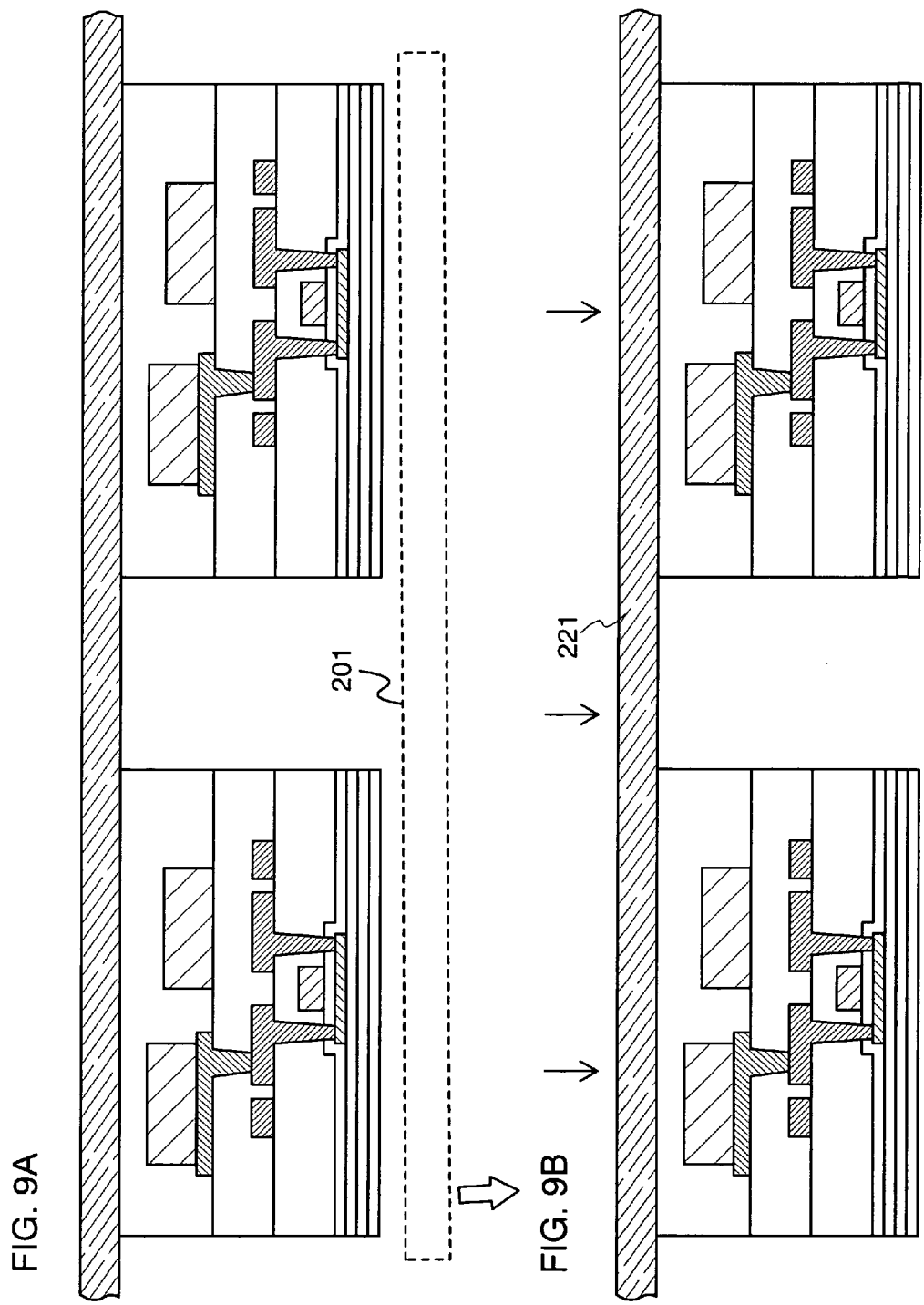

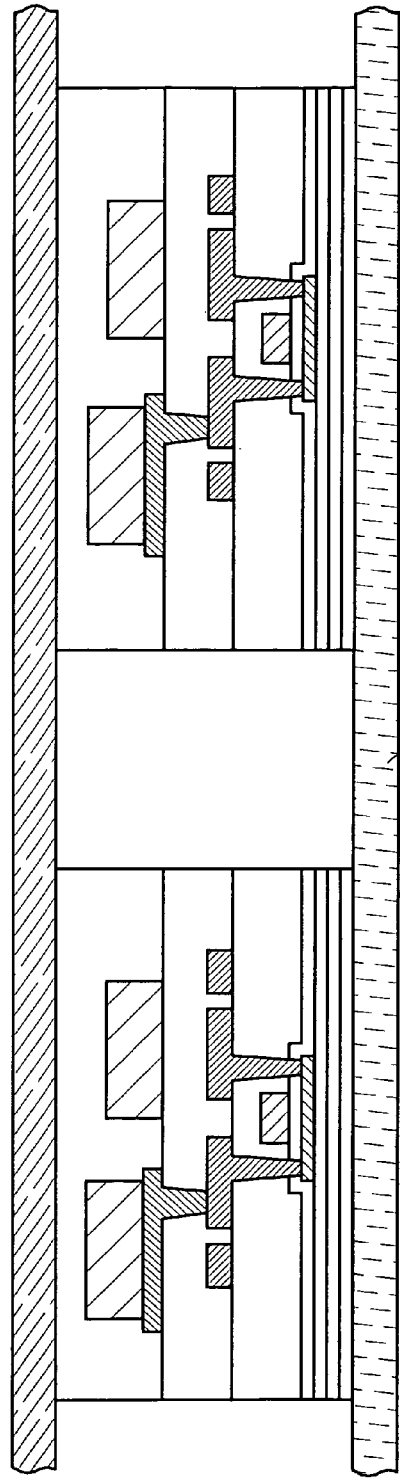
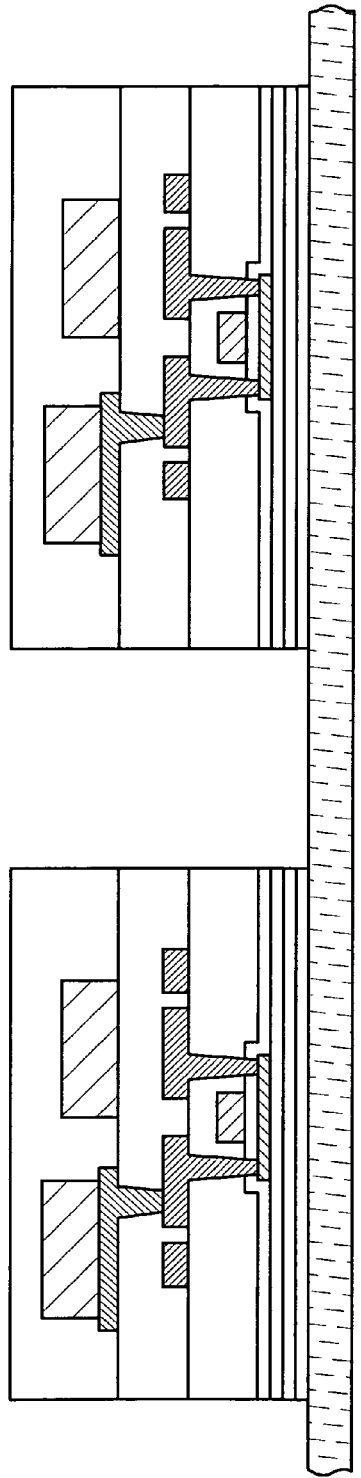
FIG. 10A
FIG. 10B
222

FIG. 15A
FIG. 15C
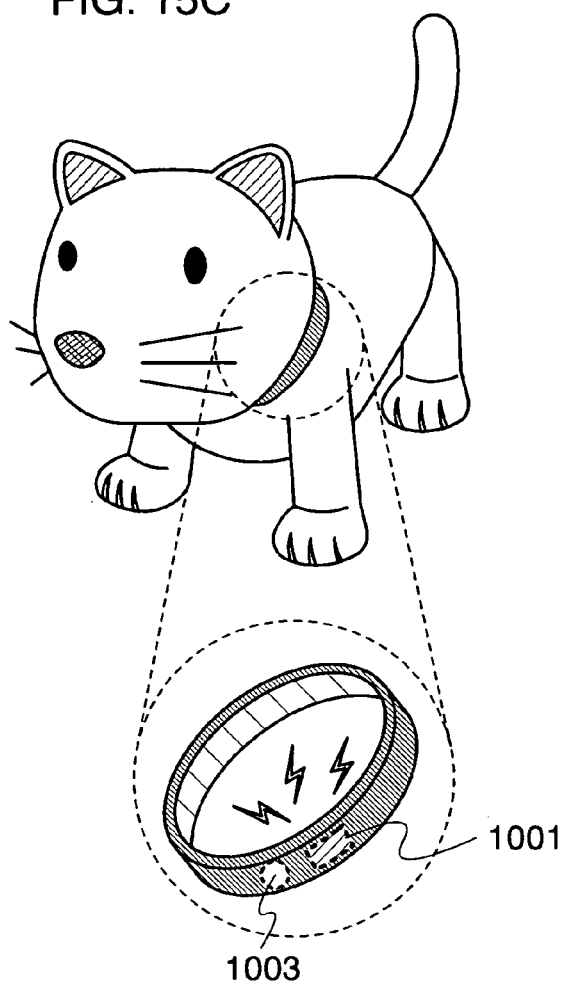
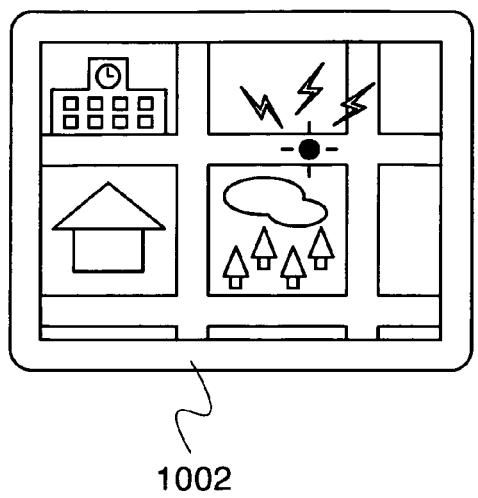
1002
1001
1003
FIG. 15B
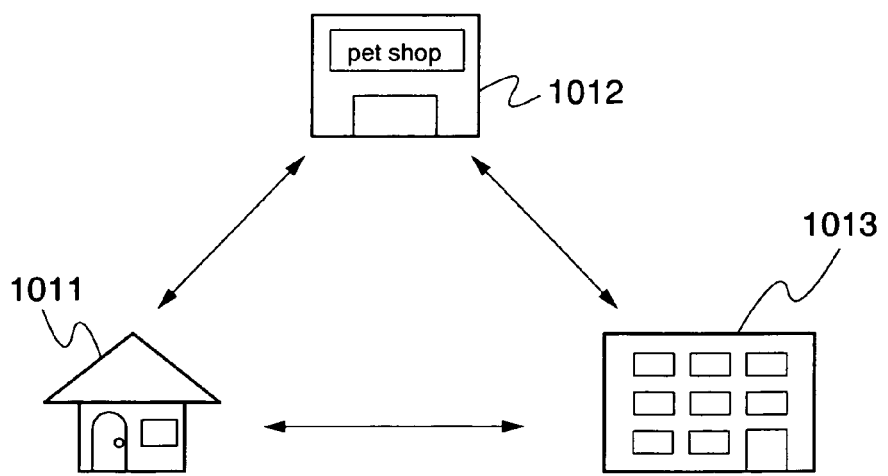
pet shop
1012
1011
1013

METHOD OF MANUFACTURING SEMICONDUCTOR DEVICE

BACKGROUND OF THE INVENTION

1. Field of the Invention

The present invention relates to a manufacturing method of a semiconductor device. More specifically, the present invention relates to a manufacturing method of a semiconductor device which is sealed using a flexible base material.

2. Description of the Related Art

Development of a card, a tag, or the like provided with a semiconductor chip which is a flake has been made. In such a card or a tag, information or the like such as personal information or a manufacturing record of merchandise is stored and is used for certification, merchandise management, or the like.

A semiconductor chip which has been used has been manufactured using a silicon wafer as a material. However, a silicon wafer is expensive and is a factor to disturb cost reduction in manufacturing a semiconductor chip.

Thus, development of a technique in which a sheet shaped or film shaped integrated circuit is manufactured by forming a thin film transistor using a glass substrate or the like and separating the thin film transistor therefrom and in which the integrated circuit is mounted on a card, a tag, or the like is performed in recent years.

Development of a technique to separate a thin film transistor from a supporting substrate such as a glass substrate has been made. For example, there is a method in which laser light is irradiated to a separation layer so that the separation layer releases hydrogen to separate a thin film transistor from a support substrate, as described in Patent Document 1.

In technical development of separating a thin film transistor from a supporting substrate, technical development of separating a thin film transistor from a supporting substrate with a high yield is essential. [Patent Document 1] Japanese Patent Laid-Open No. Hei 10-125929

SUMMARY OF THE INVENTION

It is an object of the present invention to provide a technique for manufacturing a semiconductor sheet or a semiconductor chip with a high yield using a circuit which includes a thin film transistor as a component.

In a manufacturing method of a semiconductor device according to the present invention, a step of transferring a semiconductor device fixed to a thick base material to a thinner base material is conducted repeatedly.

A manufacturing method for a semiconductor device according to the present invention comprises: attaching a flexible base material to an element layer x times (x is an integer number of 4 or more), wherein a thickness of a base material which is attached to the element layer (y+1)th (y is an integer number of 1 or more and x−1 or less) time is the same or smaller than that of a base material which is attached to the element layer y-th (y is an integer number of 1 or more and x−1 or less) time. Therefore, damage of the element layer generated by being separated from the base material can be reduced, so that a yield in manufacturing the semiconductor device is improved. In such a manufacturing method for a semiconductor device according to the present invention, each of base materials which are used in first to (x−2)th (x is an integer number of 4 or more) steps preferably has a sticking layer whose adhesive strength is deteriorated by irradiation of light such as ultraviolet light. In particular, the sticking layer preferably has the adhesive strength of more than 5000N/20 mm when being attached and less than 490N/20 mm after the irradiation of light. Therefore, separation of the element layer and the base material can be easier, so that damage of the element layer is decreased. In addition, each of base materials which are used in (x−1)th and x-th steps preferably has an adhesive layer formed from a composition which contains a thermoplastic resin as a main component. In particular, a base material having an adhesive layer formed from a hot melt adhesive is preferable. Thereby, a semiconductor device with low pollution which does little harm to a human body can be manufactured.

A manufacturing method for a semiconductor device according to the present invention comprises: sealing an element layer using two flexible base materials with same thicknesses m times (m is an integer number of 2 or more), wherein a thickness of each of base materials used in an (n+1)th (n is an integer number of 1 or more and m−1 or less) sealing is the same or smaller than that of each of base materials used in an n-th (n is an integer number of 1 or more and m−1 or less) sealing. Therefore, damage of the element layer generated by being separated from the base material can be reduced, so that a yield in manufacturing the semiconductor device is improved. In such a manufacturing method for a semiconductor device according to the present invention, each of two base materials which are used in first to (m−1)th (m is an integer number of 2 or more) steps preferably has a sticking layer whose adhesive strength is deteriorated by irradiation of light such as ultraviolet light. In particular, a base material having a sticking layer whose adhesive strength is less than 490N/20 mm after the irradiation of light is preferable. Therefore, separation of an element layer and a base material can be easier, so that damage of the element layer is decreased. In addition, each of the two base materials which are used in an m-th step preferably has an adhesive layer formed from a composition which contains a thermoplastic resin as a main component. In particular, a base material having an adhesive layer formed from a hot melt adhesive is preferable. Thereby, a semiconductor device with low-pollution which does little harm to a human body can be manufactured.

A manufacturing method for a semiconductor device according to the present invention comprises: attaching a first flexible base material to an element layer including an element between a protective layer and an insulating layer to the protective layer side, attaching a second flexible base material to the insulating layer side, separating the first flexible base material from the element layer, attaching a third flexible base material which is thinner than the first flexible base material to the protective layer side, separating the second flexible base material from the element layer to which the third flexible base material is attached, and attaching a fourth flexible base material which is thinner than the second flexible base material to the insulating layer side. Therefore, damage of the element layer generated from bending of the base materials can be reduced, so that a yield in manufacturing the semiconductor device is improved. In such a manufacturing method for a semiconductor device according to the present invention, the second flexible base material is separated from the element layer while a fifth base material having a thickness of 100 to 200 μm is attached to the third flexible base material side. Thereby damage of the element layer generated from bending of the third flexible base material can be reduced. In addition, each of the first base material and the second base material preferably has a sticking layer whose adhesive strength is deteriorated by irradiation of light such as ultraviolet light. In particular, a base material having a sticking layer whose adhesive strength is less than 490N/20 mm after irradiation of light is preferable. In addition, each of the third flexible base material and the fourth flexible base material preferably has an adhesive layer formed from a composition which contains a thermoplastic resin as a main component. In particular, a base material having an adhesive layer formed from a hot melt adhesive is preferable. Thereby, a semiconductor device with low pollution which does little harm to a human body can be manufactured.

According to the present invention, damage of an element layer due to stress can be reduced, so that a semiconductor device can be manufactured with a high yield. In addition, deterioration of an electric characteristic of an element included in an element layer due to stress can be prevented. A semiconductor device in which an element layer is sealed by a thin base material having a thickness of 50 μm or less can be manufactured according to the present invention. The semiconductor device in which an element layer is sealed by such a thin base material has a resistance to bending and is suitable for being manufactured by a roll-to-roll method.

BRIEF DESCRIPTION OF DRAWINGS

FIGS. 2A and 2B are diagrams explaining an example of a manufacturing method of a semiconductor device according to the present invention;

FIGS. 3A and 3B are diagrams explaining an example of a manufacturing method of a semiconductor device according to the present invention;

FIGS. 7A and 7B are diagrams explaining an example of a manufacturing method of a semiconductor device according to the present invention;

FIGS. 8A and 8B are diagrams explaining an example of a manufacturing method of a semiconductor device according to the present invention;

FIGS. 9A and 9B are diagrams explaining an example of a manufacturing method of a semiconductor device according to the present invention;

FIGS. 10A and 10B are diagrams explaining an example of a manufacturing method of a semiconductor device according to the present invention;

FIGS. 15A to 15C are diagrams explaining an example of a use of a semiconductor device according to the present invention.

DETAILED DESCRIPTION OF THE INVENTION

Embodiment Mode 1

An embodiment mode of a semiconductor device according to the present invention is explained with reference to FIGS. 1A, 1B, 2A, 2B, 3A, 3B, 4A, 4B, 5A, 5B, and 6.

Figure 1A:
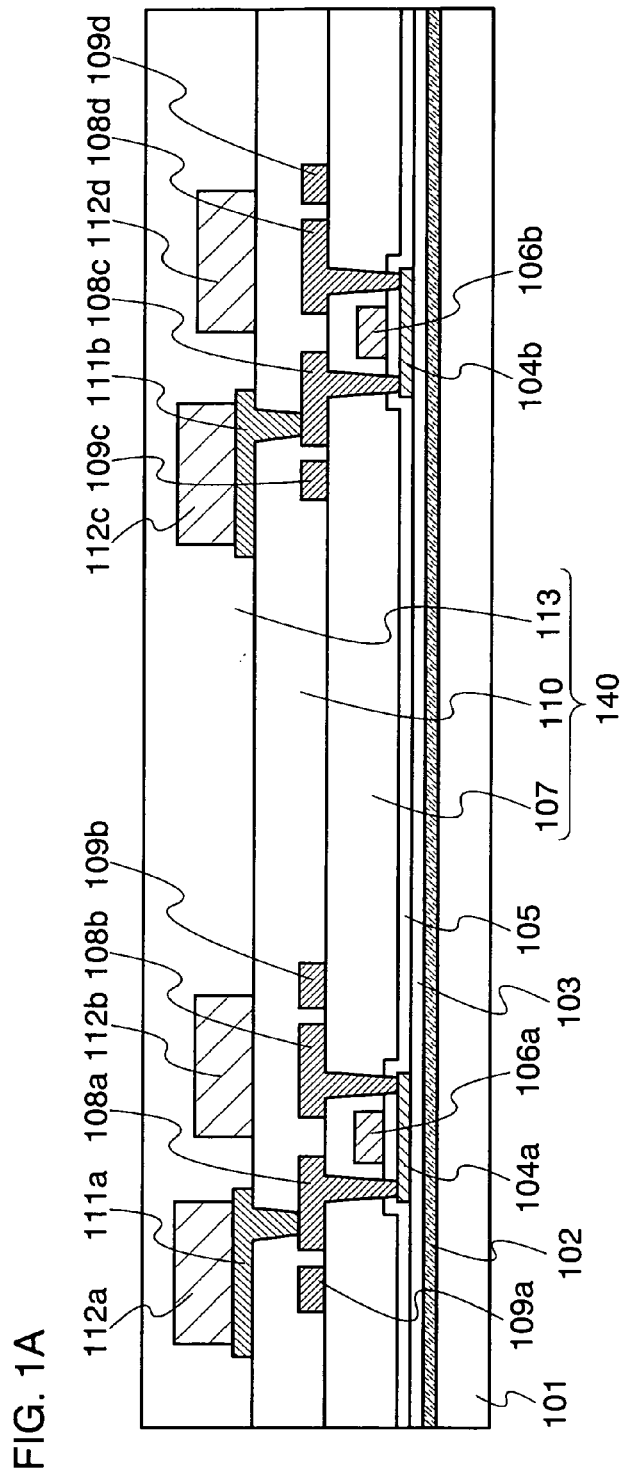
FIGS. 1A and 1B are diagrams explaining an example of a manufacturing method of a semiconductor device according to the present invention.

In FIG. 1A, a separation layer 102 is formed over a substrate 101. An insulating layer 103 is formed over the separation layer 102. A transistor including a semiconductor layer 104a or 104b, a gate insulating layer 105, a gate electrode 106a or 106b, and the like are formed over the insulating layer 103. The transistor is covered with a first interlayer insulating layer 107. Wirings 108a, 108b, 108c, 108d, 109a, 109b, 109c, and 109d are formed over the first interlayer insulating layer 107. The wirings 108a and 108b are electrically connected to the semiconductor layer 104a, and the wirings 108c and 108d are electrically connected to the semiconductor layer 104b respectively through openings formed in the first interlayer insulating layer 107. The wirings 108a to 108d and 109a to 109d are covered with a second interlayer insulating layer 110. Wirings 111a and 111b are formed over the second interlayer insulating layer 110. The wiring 111a is electrically connected to the wiring 108a and the wiring 111b is electrically connected to the wiring 108c respectively through openings formed in the second interlayer insulating layer 110. Wirings 112a, 112b, 112c, and 112d are formed over the second interlayer insulating layer 110. The wirings 112a and 112c are formed so as to be electrically connected to the wirings 111a and 111b respectively. It is to be noted that the wirings 112a and 112b are electrically connected to form one continuous wiring, and so are the wirings 112c and 112d. The wirings 112a to 112d are covered with a protective layer 113.

Here, the substrate 101 is not particularly restricted. The substrate 101 may be formed from any material selected from glass, quartz, ceramic, plastic, and the like as long as the substrate serves as a support substrate to support an element layer 140, which is a layer including an element such as a transistor, while forming the element layer 140.

The separation layer 102 is preferably a layer containing silicon or staked layers including a layer formed from metal and a layer formed from an oxide of the metal. As the layer containing silicon, a crystalline or amorphous semiconductor layer which contains silicon (Si) as a main component or a semiconductor layer which contains silicon as a main component and both of crystalline and amorphous components (the latter semiconductor is also referred to as a semiamorphous semiconductor), or the like can be given. As an example of the multilayer formed by stacking a layer formed from metal and a layer formed from an oxide of the metal, stacked layers including a layer formed from tungsten (W) and a layer formed from tungsten oxide ($WO_x$), a staked layer including a layer formed from niobium (Nb) and a layer formed from niobium oxide ($NbO_x$), a stacked layer including a layer formed from titanium (Ti) and a layer formed from titanium oxide ($TiO_x$), and the like can be given.

In addition, the insulating layer 103 is preferably formed using an insulator such as silicon oxide, silicon nitride, silicon oxynitride, or silicon nitride oxide. Silicon oxynitride is an insulator which contains both of a bond of oxygen and silicon and a bond of nitrogen and silicon and in which the number of bonds of oxygen and silicon is larger than that of bonds of nitrogen and silicon. Silicon nitride oxide is an insulator which contains both of a bond of oxygen and silicon and a bond of nitrogen and silicon and in which the number of bonds of nitrogen and silicon is larger than that of bonds of oxygen and silicon. The insulating layer 103 may be a single layer or a multilayer. It is to be noted that when the insulating layer 103 is formed using silicon nitride or silicon nitride oxide, an impurity in the substrate 101 such as alkali metal can be prevented form diffusing towards the element layer 140. Alternatively, the impurity in the substrate 101 such as alkali metal can be prevented form diffusing towards the element layer 140 by forming a layer made from silicon nitride or silicon nitride oxide between the substrate 101 and the separation layer 102.

The semiconductor layers 104a and 104b are not particularly restricted and can be formed from a semiconductor such as silicon including an amorphous or crystalline component, a semiconductor such as silicon germanium including an amorphous or crystalline component, a semiconductor such as silicon including both of amorphous and crystalline components, or a semiconductor such as silicon germanium including both of amorphous and crystalline components. Each of the semiconductor layers 104a and 104b may have a region functioning as a drain or a source and a region functioning as an active region. Besides, a region to reduce an electric field applied from a drain side may be provided between the region functioning as the drain and the region functioning as the active region.

The gate insulating layer 105 is not particularly restricted and can be formed using an insulator such as silicon oxide, silicon nitride, silicon oxynitride, or silicon nitride oxide. The gate insulating layer 105 may be a single layer or a multilayer.

The gate electrodes 106a and 106b are not particularly restricted and can be formed from a conductive material. As an example of the conductive material, metal such as tungsten, molybdenum, aluminum, and copper can be specifically given. Alternatively, an alloy of the foregoing metals and silicon, neodymium, and the like may be used. The gate electrodes 106a and 106b may be a single layer or a multilayer and the shapes thereof are not particularly restricted. The gate electrodes 106a and 106b may be formed to be a multilayer to improve an adhesive strength with the gate electrodes 106a and 106b and the gate insulating layer 105. In particular, a layer being in contact with the gate insulating layer 105 may be formed from a material which has a high adhesive strength with the gate insulting layer 105 such as titanium nitride or tantalum nitride.

It is to be noted that although a transistor is shown in FIG. 1A, a capacitor element, a resistance element, a diode, a memory element, or the like may be appropriately provided. A structure of each element is not particularly restricted. For example, a transistor may have a single drain structure or an LDD structure. In a transistor of an LDD structure, a region where a low concentration impurity region is overlapped with a gate electrode may be formed.

The first interlayer insulating layer 107 is not particularly restricted. The first interlayer insulating layer 107 may be formed from an insulator such as silicon oxide, silicon nitride, silicon oxynitride, silicon nitride oxide, or siloxane. It is to be noted that siloxane is a compound which contains elements such as silicon (Si), oxygen (O), and hydrogen (H), and further contains a Si—O—Si bond (a siloxane bond). As an example of siloxane, cyclic siloxane other than chain siloxane can be given and as a specific example, silica glass, an alkyl siloxane polymer, an alkyl silsesquioxane polymer, a hydrogenated silsesquioxane polymer, and the like can be given. Alternatively, the first interlayer insulating layer 107 may be formed from an organic insulator such as acryl or polyimide, other than the foregoing inorganic insulators. The first layer insulating layer 107 may be a single layer or a multilayer.

The wirings 108a to 108d and 109a to 109d are not particularly restricted. The wirings are preferably formed using a conductive material which has low resistance such as aluminum, or copper or an alloy containing any one of the metals and silicon, or the like. The wirings 108a to 108d and 109a to 109d may be a multilayer or a single layer. In the case of a multilayer, the wirings are preferably formed by sandwiching a layer formed from a conductive material such as aluminum between layers formed from metal nitride such as titanium nitride or tantalum nitride.

The second interlayer insulating layer 110 is not particularly restricted. The second interlayer insulating layer 110 may be formed from an insulator such as silicon oxide, silicon nitride, silicon oxynitride, silicon nitride oxide, or siloxane. Alternatively, the second interlayer insulating layer 110 may be formed from an organic insulator such as acryl, polyimide, or the like other than the foregoing inorganic insulators. The second interlayer insulating layer 110 may be a single layer or a multilayer.

The wirings 111a and 111b are not particularly restricted. The wirings 111a and 111b may be formed from a conductive material such as aluminum, copper, tungsten, or molybdenum. Alternatively, the wirings 111a and 111b may be a multilayer or a single layer.

The wirings 112a to 112d are preferably formed form a conductive material containing copper, silver, or the like as a main component. The wirings 112a to 112d are formed to function as an antenna. A forming method of the wirings 112a to 112d is not particularly restricted and may be formed by a screen printing method or the like.

The protective layer 113 is preferably formed from resin such as an epoxy resin to have a thickness of 15 to 100 µm. Thereby, unevenness of the surface of the protective layer 113 which is generated by reflecting the shape of the wirings 112a to 112d is decreased.

In the present invention, layers interposed between the insulating layer 103 and the protective layer 113 and the layers including an element such as a transistor are collectively referred to as the element layer 140.

Hereinafter, a method in which the element layer 140 is separated from the substrate 101 and sealed by a sheet or a film is explained.

Figure 1B:
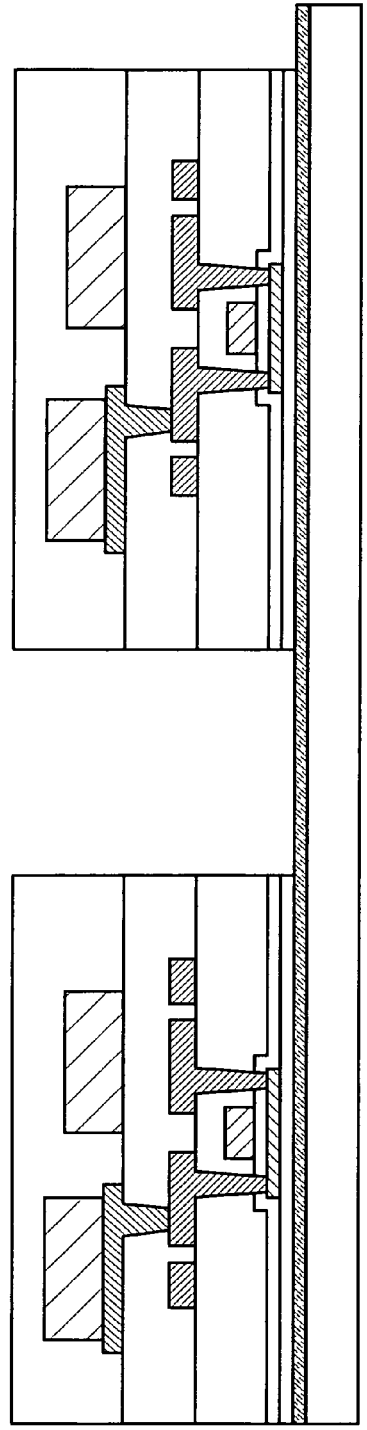

First, an opening which goes through the protective layer 113, the second interlayer insulating layer 110, the first interlayer insulating layer 107, the gate insulating layer 105, and the insulating layer 103 to reach the separation layer 102 is formed (FIG. 1B). A method for forming the opening is not particularly restricted and etching or the like may be conducted. By forming the opening, a contact area of an etchant and the separation layer 102 is enlarged when the separation layer 102 is etched. Accordingly, etching becomes easy.

Next, the separation layer 102 is etched selectively. Etching may be conducted using gas or liquid. As the etching progresses, an etchant spreads between the element layer 140 and the substrate 101 to remove the separation layer 102 (FIG. 2A). Here, in the case where the separation layer 102 contains silicon or tungsten as a main component, chlorine trifluoride ($ClF_3$) or the like is preferably used as a gas which can selectively etch the separation layer 102. In the case where the separation layer 102 is formed from silicon and is etched by wet etching, tetramethylammonium hydroxide or the like is preferably used as a liquid which can selectively etch the separation layer 102. It is to be noted that the whole part of the separation layer 102 is not necessarily etched and a part of the separation layer may remain as long as the substrate 101 and the element layer 140 can be separated from each other.

Next, a first base material 121 is attached to the protective layer 113 side of the element layer (FIG. 2B). The first base material 121 is preferably a flexible sheet or film having a thickness of 100 μm or more provided with a sticking layer whose adhesive strength is deteriorated by irradiation of ultraviolet light or heating. In particular, a sticking layer in which an adhesive strength is more than 5000N/20 mm when being attached and the adhesive strength is deteriorated by irradiation of ultraviolet light or heating to be less than 490N/20 mm is preferable. A material of the sheet or film is not particularly restricted and polyester, polyethylene terephthalate, or the like can be used. Here, since the first base material 121 is formed to have a thickness of 100 μm or more, stress generated between the first base material 121 and the substrate 101 can be reduced. Therefore, when the substrate 101 is separated from the element layer 140, the damage of the element layer 140 due to the warpage of the first base material 121 can be prevented.

Next, the substrate 101 is separated from the element layer 140 to which the first base material 121 is attached (FIG. 3A). After the substrate 101 is separated from the element layer 140, ultraviolet light is irradiated to the first base material 121 (FIG. 3B). Thereby, the adhesive strength of the first base material 121 is deteriorated. When the first base material 121 is additionally heated after the irradiation of ultraviolet light, the first base material 121 becomes easier to be peeled off and a yield is improved. The heat treatment is preferably conducted at 120 to 140° C.

Figures 4A, 4B:
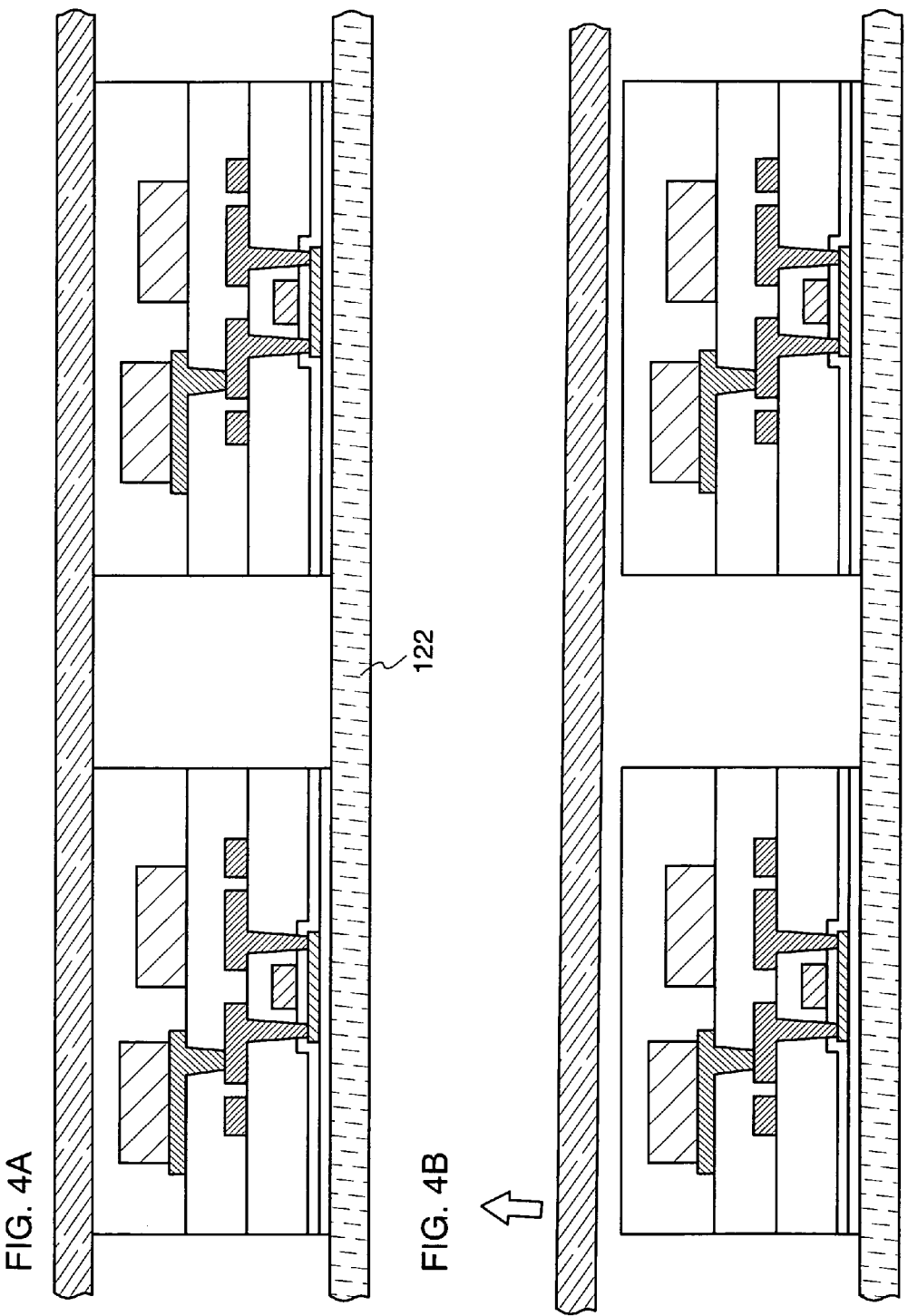
FIGS. 4A and 4B are diagrams explaining an example of a manufacturing method of a semiconductor device according to the present invention.

Next, the second base material 122 is attached to the insulating layer 103 side of the element layer (FIG. 4A). Thereby, the element layer 140 is sealed between the first base material 121 and the second base material 122 (the first sealing step). As in the case of the first base material 121, the second base material 122 is preferably a flexible sheet or film shaped base having a thickness of 100 μm or more provided with a sticking layer whose adhesive strength is deteriorated by irradiation of ultraviolet light or heating. In particular, a sticking layer in which an adhesive strength is more than 5000N/20 mm when being attached and the adhesive strength is deteriorated by irradiation of ultraviolet light or heating to be less than 490N/20 mm is preferable. A material of the base is not particularly restricted and polyester, polyethylene terephthalate, or the like can be used. Here, since the second base material 122 is formed to have a thickness of 100 μm or more, the damage of the element layer 140 due to the warpage of the first base material 121 can be prevented when the first base material 121 is separated from the element layer 140.

Figure 5A:
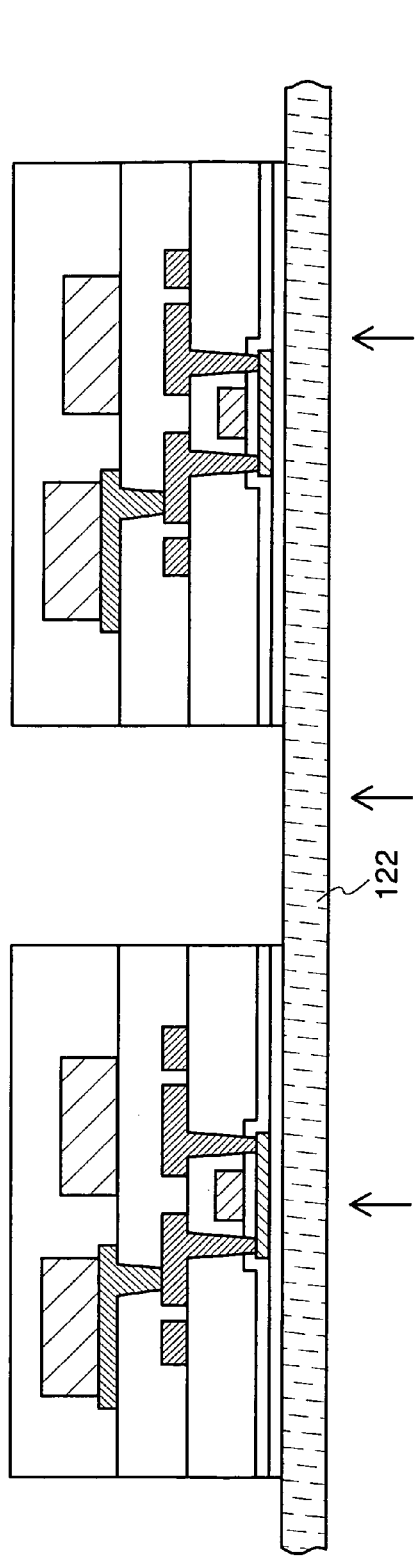
FIGS. 5A and 5B are diagrams explaining an example of a manufacturing method of a semiconductor device according to the present invention.

After the first base material 121 is peeled off from the element layer 140 (FIG. 4B), ultraviolet light is irradiated to the second base material 122 (FIG. 5A). Thereby, the adhesive strength of the second base material 122 is deteriorated. When the second base material 122 is additionally heated after the irradiation of ultraviolet light, the second base material 122 becomes easier to be peeled off and a yield is improved. The heat treatment is preferably conducted at 120 to 140° C.

Figure 5B:
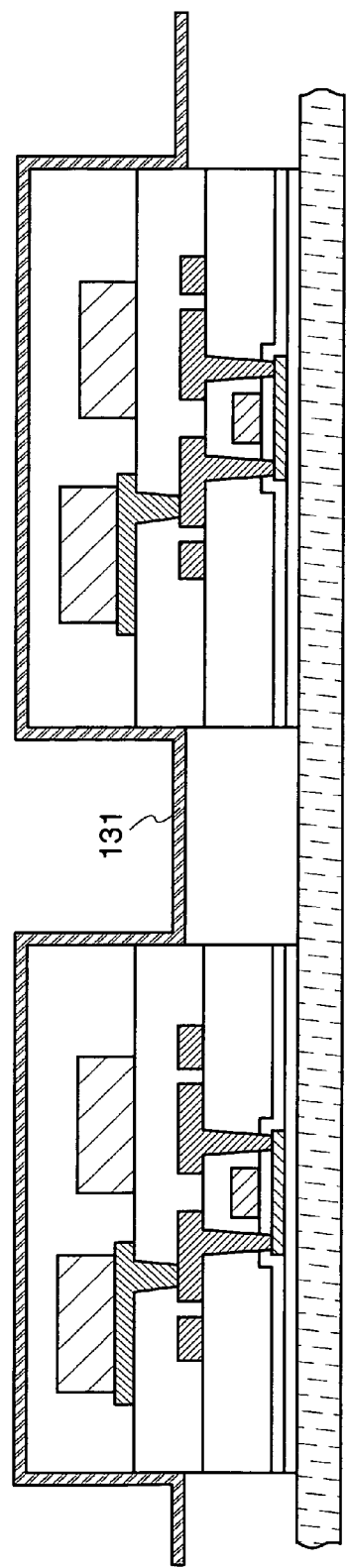

Next, a third base material 131 is attached to the protective layer 113 side of the element layer (FIG. 5B). The third base material 131 is preferably a flexible sheet or film shaped base having a thickness of 50 μm or less provided with an adhesive layer which contains a thermoplastic resin as a main component. More specifically, the adhesive layer is preferably formed from a composition which contains ethylene vinyl acetate copolymer (EVA), poly ester, poly amide, thermoplastic elastomer, polyolefine, or the like, or a derivative of each of the foregoing materials as a main component, which is referred to as a hot melt adhesive, or the like. A hot melt adhesive is an adhesive which does not contain an organic solvent and which is solidified by cooling after having melted by heating to attach objects together. A hot melt adhesive has advantages that an adhesion time is short, that there is little effect to a human body, and the like. In addition, the base is preferably formed from a material whose softening temperature is higher than that of the adhesive layer, and can be formed from polyester, polyethylene terephthalate, or the like, for example.

Figure 6:
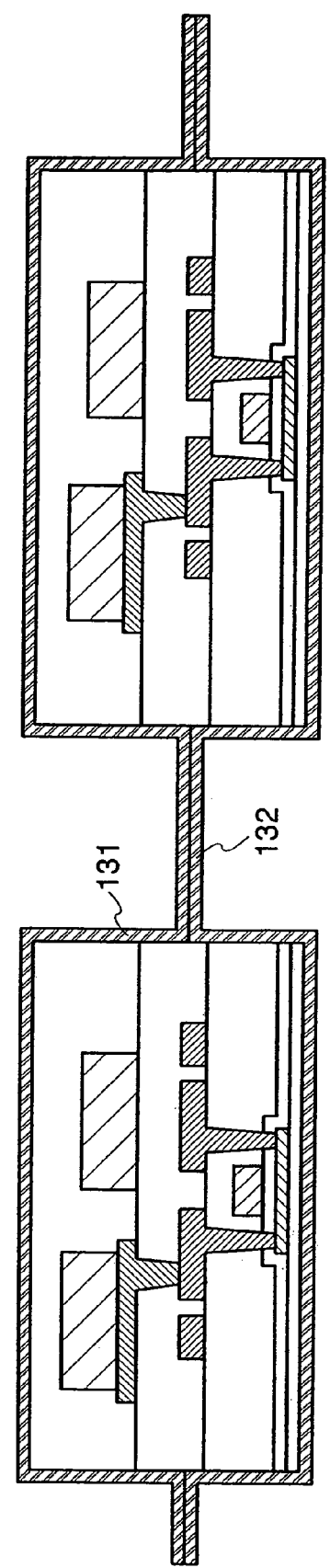
FIG. 6 is a diagram explaining an example of a manufacturing method of a semiconductor device according to the present invention.

Next, the second base material 122 is peeled off. When peeling the second base material 122, a removable film or removable sheet having a thickness of 100 to 200 μm is preferably attached as a supporting base material to the third base material 131, that is, to a base material which is thinner than the other. The damage of the element layer 140 due to the warpage of the third base material 131 can be prevented by attaching the supporting base material. It is to be noted that a base material or the like which has an adhesive strength deteriorated by irradiation of ultraviolet light is preferred as the supporting base material as in the case of the first base material 121 and the second base material 122. After the second base material 122 is peeled off, a fourth base material 132 is attached to the insulating layer 103 side of the element layer (FIG. 6). As in the case of the third base material 131, the fourth base material 132 is preferably a flexible sheet or film shaped base having a thickness of 50 μm or less provided with an adhesive layer which contains a thermoplastic resin as a main component. More specifically, the adhesive layer is preferably formed from a composition which contains ethylene vinyl acetate copolymer (EVA), poly ester, poly amide, thermoplastic elastomer, polyolefine, or the like, or a derivative of each of the foregoing materials as a main component, which is referred to as a hot melt adhesive. The base is preferably formed from a material whose softening temperature is higher than that of the adhesive layer, and can be formed from polyester, polyethylene terephthalate, or the like, for example.

By the foregoing steps, the element layer 140 is sealed by the third base material 131 and the fourth base material 132 (the second sealing step). A sheet shaped semiconductor device which has a resistance to bending can be provided by sealing the element layer 140 using a thin base material having a thickness of 50 μm or less as in the case of the third base material 131 and the fourth base material 132. Such a semiconductor device having a resistance to bending is suitable to be manufactured particularly by a production system referred to as a roll-to-roll method. In addition, the element layer 140 is not transferred from the substrate 101 to a thin flexible base material such as the third base material 131 and the fourth base material 132 directly. After the element layer 140 is transferred to the first base material 121 and the second base material 122, the element layer 140 is further transferred to a thin base material such as the third base material 131 and the fourth base material 132. Therefore, breakdown of the element layer 140 and/or deterioration of an electrical characteristic of an element in the element layer 140 due to stress can be reduced, so that a yield is improved. In addition, as shown in this embodiment mode, a thin base material is attached to the protective layer 113 side of the element layer formed from resin before the thin base material is attached to the insulating layer 103 side of the element layer formed from an inorganic material, thereby damage of the element layer 140 which is generated due to stress can be reduced even more.

It is to be noted that in this embodiment mode, each of the third base material 131 and the fourth base material 132 attached to the protective layer 113 side and the insulating layer 103 side of the element layer has a structure in which an adhesive layer is provided to a sheet shaped or film shaped base. However, the protective layer 113 side and the insulating layer 103 side may be only coated with a composition which contains a thermoplastic resin as a main component. After coating the protective layer 113 side or the insulating layer 103 side, a flexible base material having a thickness of 50 μm or less may be attached thereover.

In addition, the third base material 131 and the fourth base material 132 may be covered with a film which is formed from silicon oxide, silicon nitride, silicon oxynitride, silicon nitride oxide, or the like. Penetration of moisture into the element layer 140 through the base material and the like can be reduced by employing such a structure.

Embodiment Mode 2

In this embodiment mode, an embodiment mode of the present invention when a separation layer has a structure including stacked layers having a layer formed from metal and a layer formed from an oxide of the metal is explained with reference to FIGS. 7A, 7B, 8A, 8B, 9A, 9B, 10A, 10B, 11A, 11B, and 12A.

In FIG. 7A, an insulating layer 202 is formed over a substrate 201 and a separation layer 203 is formed over the insulating layer 202. The separation layer 203 is formed by stacking a first layer 203a formed from metal and a second layer 203b formed from an oxide of the metal. An insulating layer 204, an insulating layer 205, and an insulating layer 206 are stacked over the insulating layer 203 sequentially. A transistor and the like including a semiconductor layer 207a or 207b, a gate insulating layer 208, and a gate electrode 209a or 209b is formed over the insulating layer 206. The transistor is covered with a first interlayer insulating layer 210. Wirings 211a, 211b, 211c, 211d, 212a, 212b, 212c, and 212d are formed over the first interlayer insulating layer 210. The wirings 211a and 211b are electrically connected to the semiconductor layer 207a and the wirings 211c and 211d are electrically connected to the semiconductor layer 207b respectively through openings formed in the first interlayer insulating layer 210. The wirings 211a to 211d and 212a to 212d are covered with a second interlayer insulating layer 213. Wirings 214a and 214b are formed over the second interlayer insulating layer 213. The wiring 214a is electrically connected to the wiring 211a and the wiring 214b is electrically connected to the wiring 211c respectively through openings formed in the second interlayer insulating layer 213. Wirings 215a, 215b, 215c, and 215d are formed over the second interlayer insulating layer 213. The wirings 215a and 215c are formed to be electrically connected to the wirings 214a and 214b respectively. It is to be noted that the wirings 215a and 215b are electrically connected to form one continuous wiring, and so are the wirings 215c and 215d. The wirings 215a to 215d are covered with a protective layer 216.

The substrate 201, the semiconductor layers 207a and 207b, the gate insulating layer 208, the gate electrodes 209a and 209b, the first interlayer insulating layer 210, the wirings 211a to 211d and 212a to 212d, the second interlayer insulating layer 213, the wirings 214a and 214b and 215a to 215d, the protective layer 216 are respectively similar to the substrate 101, the semiconductor layers 104a and 104b, the gate insulating layer 105, the gate electrodes 106a and 106b, the first interlayer insulating layer 107, the wirings 108a to 108d and 109a to 109d, the second interlayer insulating layer 110, the wirings 111a and 111b, and 112a to 112d, and the protective layer 113 which are mentioned in Embodiment Mode 1. Accordingly, the insulating layers 202 and 204 to 206, and the separation layers 203 (203a and 203b) are explained in this embodiment mode.

The insulating layer 202 is preferably formed from silicon oxynitride. In the separation layer 203, the first layer 203a is preferably formed from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), and iridium (Ir) or an alloy containing any one of the elements as a main component. The second layer 203b is preferably formed from an oxide of the metal which is used for the first layer 203a. Thereby, separation between the substrate and the element layer 240 is performed well, so that a yield is improved. The insulating layer 204 is preferably formed from silicon oxide. More specifically, the insulating layer 204 is preferably formed from silicon oxide by a sputtering method. In particular, in the case where the first layer 203a is formed from tungsten, the second layer 203b can be also formed when forming the insulating layer 204 over the first layer 203a by a sputtering method. In addition, the insulating layer 205 is preferably formed from silicon nitride oxide or silicon nitride. Thereby, an impurity contained in the substrate 201 can be prevented from diffusing to the element layer 240. The insulating layer 206 is preferably formed from silicon oxynitride or silicon oxide so that stress can be smaller than stress generated when the semiconductor layers 207a and 207b are stacked directly over the insulating layer 205.

In the present invention, layers interposed between the insulating layer 205 and the protective layer 216 and the layers including an element such as a transistor is collectively referred to as the element layer 240.

A method of sealing the element layer 240 using a flexible base material after the substrate 201 is separated from the element layer 240 is explained hereinafter.

At first, an opening which goes through the protective layer 216, the second interlayer insulating layer 213, the first interlayer insulating layer 210, the gate insulating layer 208, the insulating layers 205 and 206, and the like to reach the separation layer 203 is formed (FIG. 7B). A method for forming the opening is not particularly restricted and etching or the like may be conducted. By forming the opening, a contact area of an etchant and the separation layer 203 is enlarged when the separation layer 203 is etched. Accordingly, etching becomes easy.

Next, the separation layer 203 is etched selectively. Etching may be conducted using gas or liquid. As the etching progresses, an etchant spreads between the element layer 240 and the insulating layer 202 to remove the separation layer 203 (FIG. 8A). Here, in the case where the separation layer 203 contains silicon or tungsten as a main component, chlorine trifluoride ($ClF_3$) or the like is preferably used as a gas which can selectively etch the separation layer 203. In the case where the separation layer 203 is formed from silicon and is etched by wet etching, tetramethylammonium hydroxide or the like is preferably used as a liquid which can selectively etch the separation layer 203. It is to be noted that the whole part of the separation layer 203 is not necessarily etched and a part of the separation layer may remain as long as the insulating layer 202 and the element layer 240 can be separated from each other.

Next, a first base material 221 is attached to the protective layer 216 side of the element layer (FIG. 8B). Hereby, the element layer 240 is sealed between the first base material 221 and the substrate 201 (the first sealing step). Since the first base material 221 is similar to the first base material 121 in Embodiment Mode 1, a description in Embodiment Mode 1 is applied and a description of the first base material 221 is omitted in this embodiment mode.

Next, the substrate 201 is separated from the element layer 240 to which the first base material 221 is attached (FIG. 9A). After the substrate 201 is separated from the element layer 240, ultraviolet light is irradiated to the first base material 221 (FIG. 9B). Thereby, the adhesive strength of the first base material 221 is deteriorated. When the first base material 221 is additionally heated more after the irradiation of ultraviolet light, the first base material 221 becomes easier to be peeled off and a yield is improved. The heat treatment is preferably conducted at 120 to 140° C.

Next, a second base material 222 is attached to the insulating layer 204 side of the element layer (FIG. 10A). Since the second base material 222 is similar to the second base material 122 in Embodiment Mode 1, a description in Embodiment Mode 1 is applied and a description of the second base material 222 is omitted in this embodiment mode.

Figure 11A:
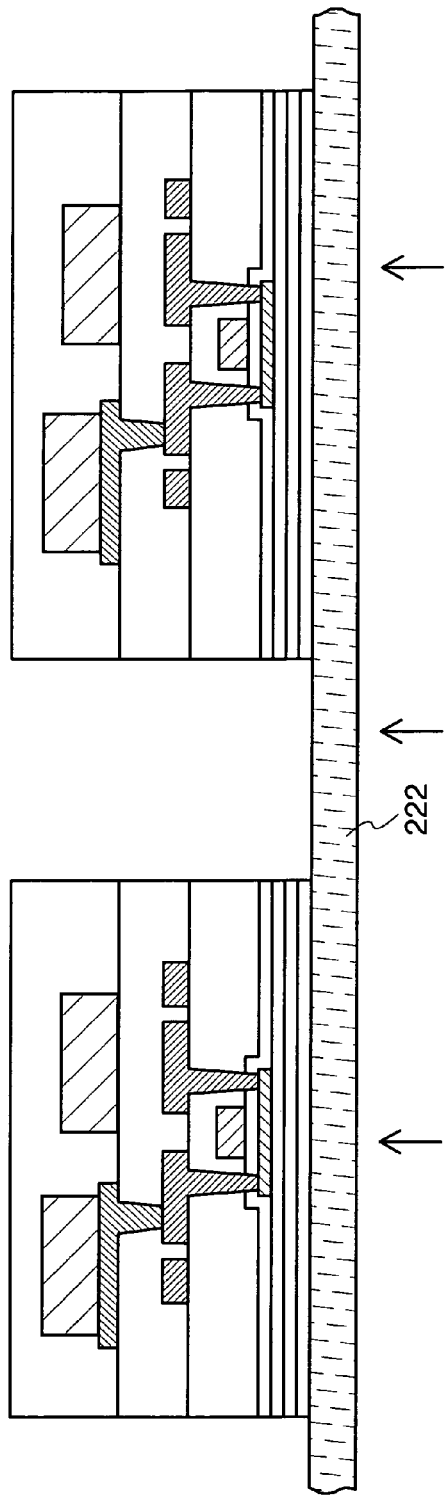
FIGS. 11A and 11B are diagrams explaining an example of a manufacturing method of a semiconductor device according to the present invention.

Next, the first base material 221 is peeled off (FIG. 10B) and ultraviolet light is irradiated to the second base material 222 (FIG. 11A). Thereby, the adhesive strength of the second base material 222 is deteriorated. When the second base material 222 is additionally heated after the irradiation of ultraviolet light, the second base material 222 becomes easier to be peeled off and a yield is improved. The heat treatment is preferably conducted at 120 to 140° C.

Figure 11B:
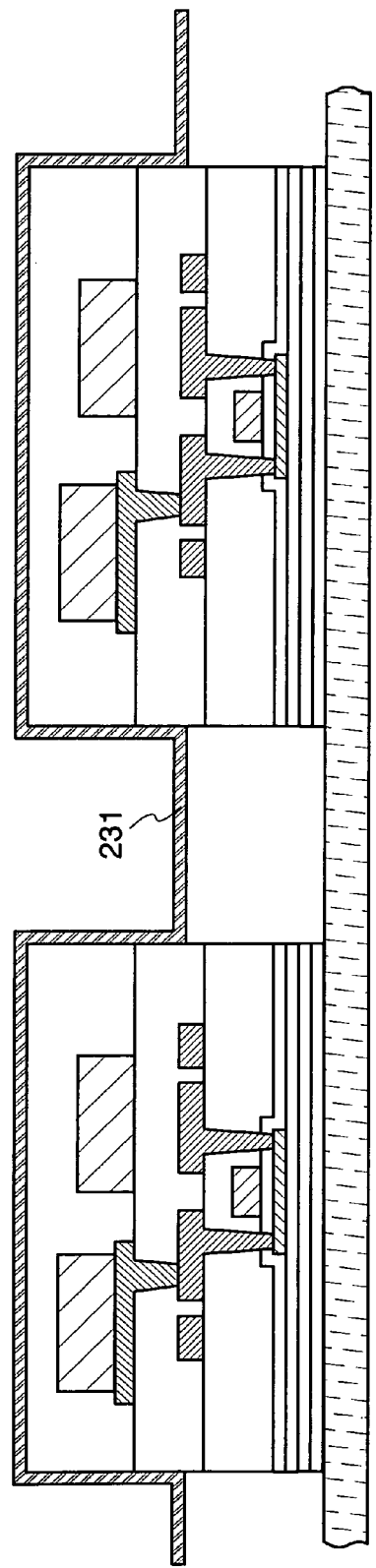

Next, a third base material 231 is attached to the protective layer 216 side of the element layer (FIG. 11B). Since the third base material 231 is similar to the third base material 131 in Embodiment Mode 1, a description in Embodiment Mode 1 is applied and a description on the third base material 231 is omitted in this embodiment mode.

Figure 12:
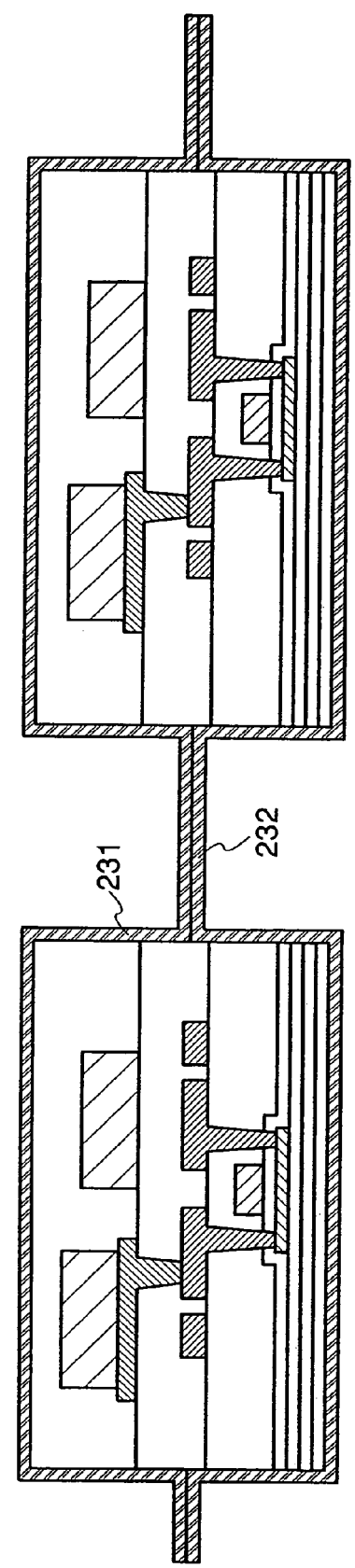
FIG. 12 is a diagram explaining an example of a manufacturing method of a semiconductor device according to the present invention.

Next, the second base material 222 is peeled off and a fourth base material 232 is attached to the insulating layer 204 side of the element layer (FIG. 12). Since the fourth base material 232 is similar to the fourth base material 132 in Embodiment Mode 1, a description in Embodiment Mode 1 is applied and a description on the fourth base material 232 is omitted in this embodiment mode.

By the foregoing steps, the element layer 240 is sealed by the third base material 231 and the fourth base material 232 (the second sealing step). A sheet shaped semiconductor device which has a resistance to bending can be provided by sealing the element layer 240 using a thin base material having a thickness of 50 μm or less such as the third base material 231 and the fourth base material 232. Such a semiconductor device having a resistance to bending is suitable to be manufactured particularly by a production system referred to as a roll-to-roll method. In addition, the element layer 240 is not transferred from the substrate 201 to a thin flexible base material such as the third base material 231 and the fourth base material 232 directly. After the element layer 240 is transferred to the first base material 221 and the second base material 222, the element layer 240 is transferred to a thin base material such as the third base material 231 and the fourth base material 232. Therefore, breakdown of the element layer 240 and/or deterioration of an electrical characteristic of an element in the element layer 240 due to stress can be reduced, so that a yield is improved. In addition, as shown in this embodiment mode, a thin base material is attached to the protective layer 216 side of the element layer formed from resin before the thin base material is attached to the insulating layer 204 side of the element layer formed from an inorganic material, thereby damage of the element layer 240 which is generated due to stress can be reduced even more.

It is to be noted that in this embodiment mode, each of the third base material 231 and the fourth base material 232 attached to the protective layer 216 side and the insulating layer 204 side of the element layer has a structure in which an adhesive layer is provided to a sheet shaped or film shaped base. However, the protective layer 216 side and the insulating layer 204 side may be only coated with a composition which contains a thermoplastic resin as a main component. After coating the protective layer 216 side or the insulating layer 204 side, a flexible base material having a thickness of 50 μm or less may be attached thereover.

In addition, the third base material 231 and the fourth base material 232 may be covered with a film which is formed from silicon oxide, silicon nitride, silicon oxynitride, silicon nitride oxide, or the like. Penetration of moisture into the element layer 240 through the base material and the like can be reduced by employing such a structure.

Embodiment Mode 3

Figure 13:
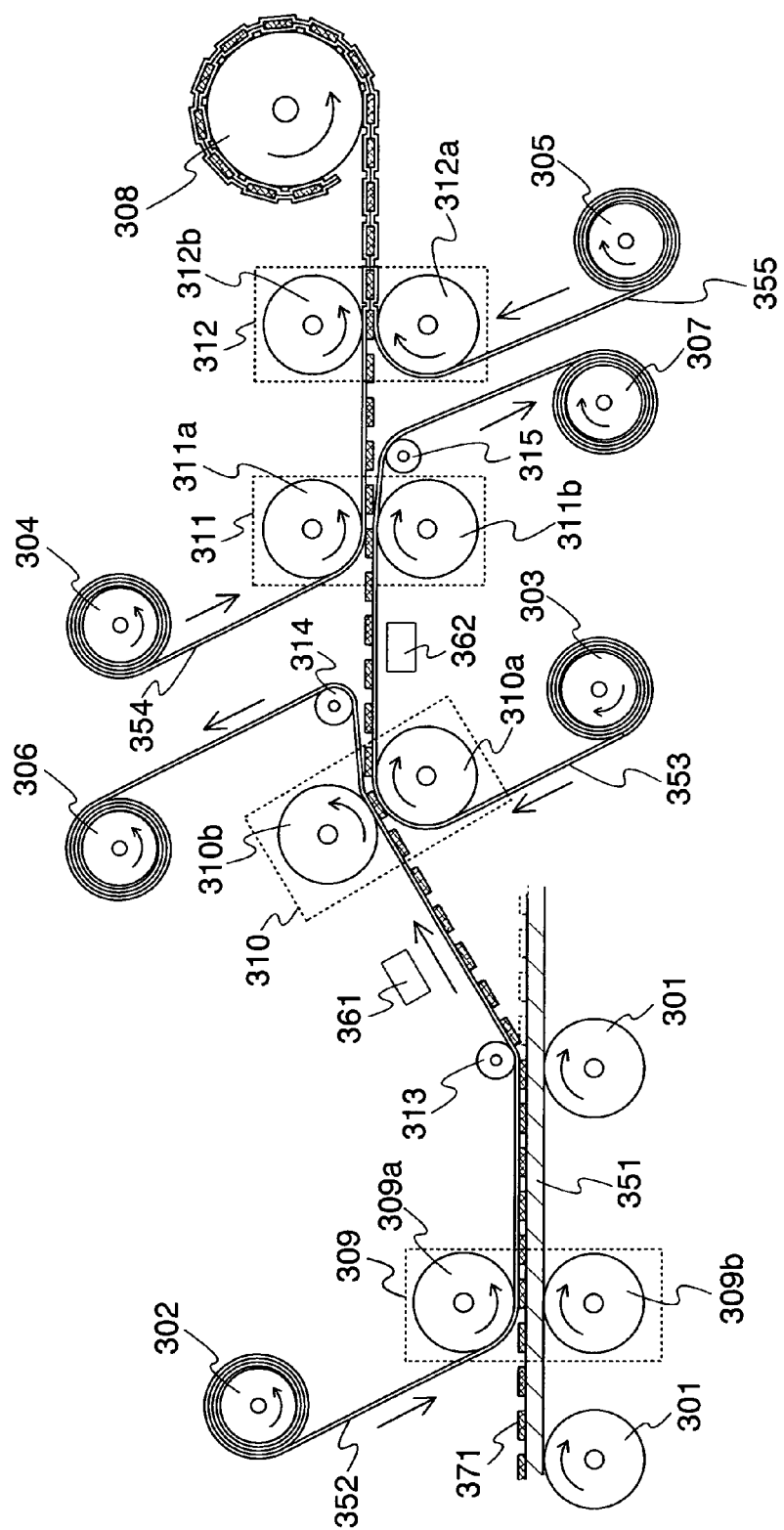
FIG. 13 is a diagram explaining an example of a manufacturing method of a semiconductor device according to the present invention by a roll-to-roll method.

In this embodiment mode, an embodiment in which a roll-to-roll method is applied to the present invention is explained with reference to FIG. 13.

The manufacturing apparatus to be used in this embodiment mode has a delivery means 301 for delivering an object to be processed, a first supply means 302 for supplying a first base material 352, a second supply means 303 for supplying a second base material 353, a third supply means 304 for supplying a third base material 354, a fourth supply means 305 for supplying a fourth base material 355, a first collection means 306 for collecting the first base material 352, a second collection means 307 for collecting the second base material 353, a third collecting means 308 for collecting the object to be processed, a first adhesion means 309 for attaching the first base material 352 to the object to be processed, a second adhesion means 310 for attaching the second base material 353 to the object to be processed with the first base material 352 attached, a third adhesion means 311 for attaching the third base material 354 to the object to be processed with the second base material 353 attached, and a fourth adhesion means 312 for attaching the fourth base material 355 to the object to be processed with the third base material 354 attached. Besides, the manufacturing apparatus to be used in this embodiment mode also has a first delivery roller 313 and a second delivery roller 314 functioning as shafts to adjust a direction to which the first base material 352 is delivered, and a third delivery roller 315 functioning as a shaft to adjust a direction to which the second base material 353 is delivered. Each of the first adhesion means 309, the second adhesion means 310, the third adhesion means 311, and the fourth adhesion means 312 has two rollers. These rollers are combined so that the object to be processed and the base material are sandwiched therebetween and pressure is added thereto to attach the object to be processed to the base material. It is to be noted that although the structures of the first to the fourth supply means 302 to 305 and the first to the fourth collection means 306 to 308 are not particularly restricted, both of the supply means and the collection means include rolls in this embodiment mode.

An example in which the present invention described in Embodiment Modes 1 and 2 are carried out using the foregoing apparatus is explained.

First, a substrate 351 provided with an element layer 371 in which a separation layer has been etched is delivered by the delivery means 301 to the first adhesion means 309. The first adhesion means 309 has a first roller 309a a and a second roller 309b each of which has a different rotation direction from the other. In the first adhesion means 309, the first base material 352 is delivered from the first supply means 302 along the first roller 309a to be sandwiched between the first roller 309a and the second roller 309b and the substrate 351 is also delivered to be sandwiched between the first roller 309a and the second roller 309b. Thereby the first base material 352 is attached to the element layer 371 so that the element layer 371 is sandwiched between the substrate 351 and the first base material 352.

Next, the first base material 352 is delivered by the first delivery roller 313 to a direction which is different from the direction to which the substrate 351 is delivered. Thereby the element layer 371 and the substrate 351 are separated from each other and the element layer 371 is attached only to the first base material 352. Then, the first base material 352 with the element layer 371 attached is delivered to the second adhesion means 310. A first irradiation means 361 for irradiating ultraviolet light is provided between the first delivery roller 313 and the second adhesion means 310. The first base material 352 is irradiated with ultraviolet light after the element layer 371 and the substrate 351 are separated from each other and before the first base material 352 and the element layer 371 are delivered to the second adhesion means 310. Thus, the adhesive strength of a sticking layer of the first base material 352 is deteriorated.

The second adhesion means 310 has a first roller 310a and a second roller 310b each of which has a different rotation direction from the other. In the second adhesion means 310, the second base material 353 is delivered from the second supply means 303 along the first roller 310a to be sandwiched between the first roller 310a and the second roller 310b and also the first base material 352 with the element layer 371 attached is also delivered to be sandwiched between the first roller 310a and the second roller 310b Thereby the second base material 353 is attached to the element layer 371 so that the element layer 371 is sandwiched between the first base material 352 and the second base material 353.

Next, the first base material 352 is delivered by the second delivery roller 314 to a direction which is different from the direction to which the second base material 353 is delivered. Thereby the element layer 371 and the first base material 352 are separated from each other and the element layer 371 is attached only to the second base material 353. The first base material 352 is rolled around the first collection means 306 to be collected. Then, the second base material 353 with the element layer 371 attached is delivered to the third adhesion means 311. A second irradiation means 362 for irradiating ultraviolet light is provided between the second delivery roller 314 and the third adhesion means 311. The second base material 353 is irradiated with ultraviolet light after the element layer 371 and the first base material 352 are separated from each other and before the second base material 353 and the element layer 371 are delivered to the third adhesion means 311. Thus, the adhesive strength of a sticking layer of the second base material 353 is deteriorated.

The third adhesion means 311 has a first roller 311a and a second roller 311b each of which has a different rotation direction from the other. In the third adhesion means 311, the third base material 354 is delivered from the third supply means 304 along the first roller 311a to be sandwiched between the first roller 311a and the second roller 311b and the second base material 353 with the element layer 371 attached is also delivered to be sandwiched between the first roller 311a and the second roller 311b. The first roller 311a is provided with a heating means and an adhesive layer of the third base material 354 is softened by heat from the first roller 311a. Thereby the third base material 354 is attached to the element layer 371 so that the element layer 371 is sandwiched between the second base material 353 and the third base material 354.

Next, the second base material 353 is delivered by the third delivery roller 315 to a direction which is different from the direction to which the third base material 354 is delivered. Thereby the element layer 371 and the second base material 353 are separated from each other and the element layer 371 is attached only to the third base material 354. The second base material 353 is rolled around the second collection means 307 to be collected. Then, the third base material 354 with the element layer 371 attached is delivered to the fourth adhesion means 312.

The fourth adhesion means 312 has a first roller 312a and a second roller 312b each of which has a different rotation direction from the other. In the fourth adhesion means 312, the fourth base material 355 is delivered from the fourth supply means 305 along the first roller 312a to be sandwiched between the first roller 312a and the second roller 312b and the third base material 354 with the element layer 371 attached is also delivered to be sandwiched between the first roller 312a and the second roller 312b. The first roller 312a is provided with a heating means and an adhesive layer of the fourth base material 355 is softened by heat from the first roller 312a. Thereby the fourth base material 355 is attached to the element layer 371 so that the element layer 371 is sandwiched between the third base material 354 and the fourth base material 355.

As described above, a semiconductor device in which the element layer 371 is sealed between the third base material 354 and the fourth base material 355 can be manufactured. This semiconductor device is rolled around the third collection means 308 to be collected. When a semiconductor device is rolled around a roll to be collected, the semiconductor device is not necessary to be bent. Therefore, damage due to bending of the semiconductor device can be prevented. In addition, since the semiconductor device of the present invention has a resistance to bending, damage is rarely caused from bending even when it is rolled around a roll having a short inner radius. Therefore, the semiconductor device according to the present invention can be manufactured with a high yield.

Embodiment Mode 4

In the present invention, a structure and a circuit structure of an element such as a transistor formed in an element layer are not particularly restricted.

Figure 14:
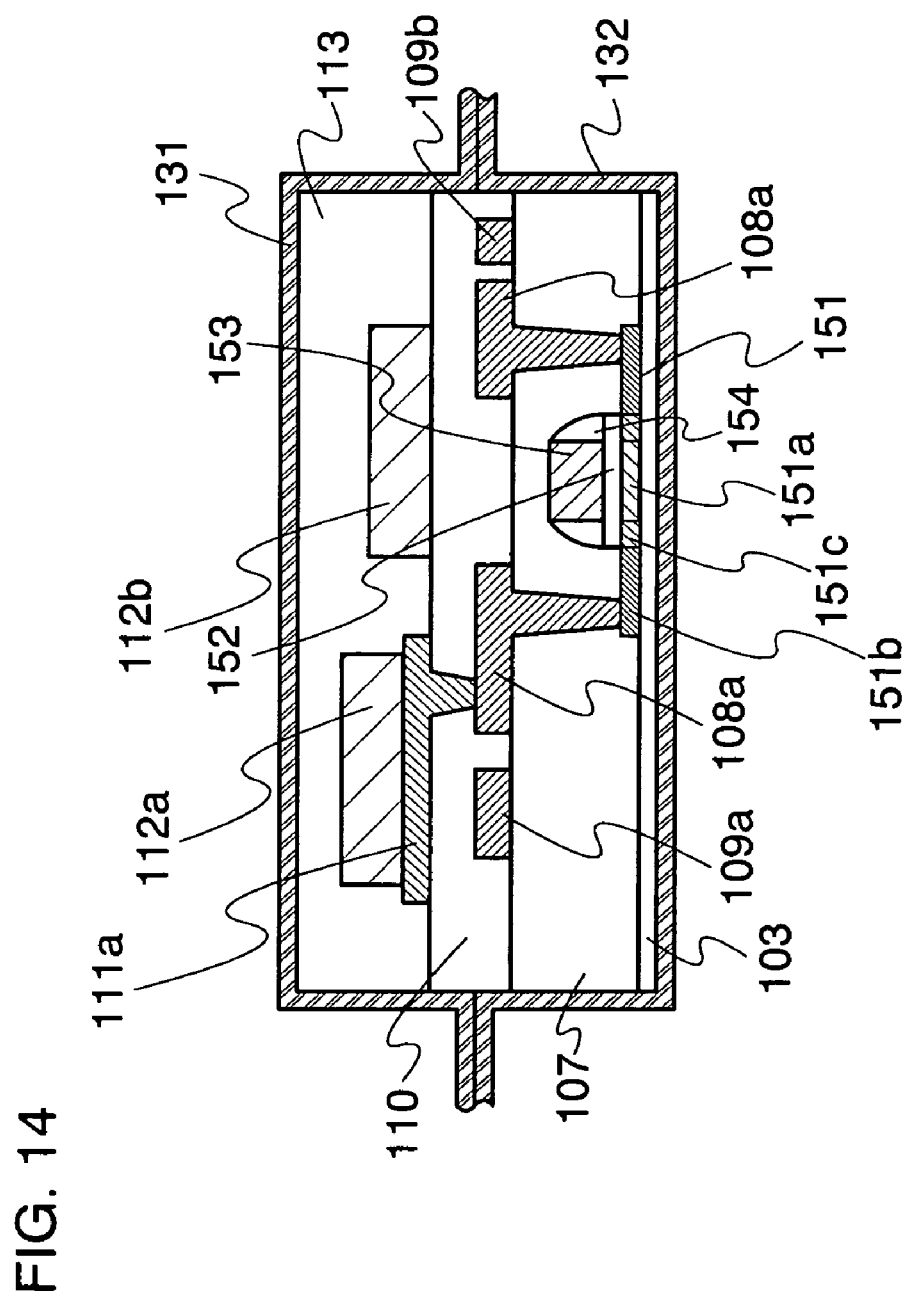
FIG. 14 is a diagram explaining an example of a structure of a semiconductor device according to the present invention.

A transistor, for example, may have an LDD structure which has a semiconductor layer 151 having an impurity region 151c of low concentration between a region 151a functioning as an active region and a region 151b functioning as a drain or a source as shown in FIG. 14. In addition, a sidewall 154 may be formed on side walls of a gate electrode 153. The sidewall 154 serves as a mask, when forming the region 151b, to prevent an impurity from being added to the region 151c to form a high concentration impurity region. The sidewall 154 is formed from an insulator such as silicon oxide. A gate insulating layer 152 formed between the semiconductor layer 151 and the gate electrode 153 may be formed to cover only the semiconductor layer 151 like a semiconductor device shown in this embodiment mode. In a transistor of such a structure, an electric field from a region which functions as a drain is particularly reduced and deterioration of a transistor due to a hot carrier can be reduced.

In FIG. 14, portions having functions similar to those in FIGS. 1A and 1B are denoted by the same reference numerals as shown in FIGS. 1A and 1B.

Embodiment Mode 5

A semiconductor device according to the present invention manufactured following the method described in Embodiment Modes 1 to 3 and the like can be mounted on an article such as a card or a packing container for foods or the like. When the semiconductor device is mounted on a card, the card serves as an identification card which has personal information such as a name, a blood type, height, weight, and an address. When mounted on a packing container for foods or the like, it serves as a means to store information such as a production district, a producer of food, a production district of an ingredient, and a date of manufacture and to provide such information to a dealer, a consumer, and the like. The semiconductor device which is manufactured by a manufacturing method according to the present invention does little harm to a human body; therefore, the present invention is particularly effective in the case where high safety is required, for example, in the case of being mounted on food, a person, an animal, or the like.

In addition, a semiconductor device according to the present invention may be mounted on personal belongings such as a portable telephone or a wallet for obtaining positional information of the owner of a communication device or managing personal information of the owner.

As shown in FIG. 15C, a semiconductor device 1001 according to the present invention may be mounted on a pet collar or the like so that the pet can carry the semiconductor device. Thereby, if a pet runs away and is lost, positional information of the pet can be known by using a monitor 1002 or the like (FIG. 15A) (in that case, a battery 1003 for sending an electric wave is preferably provided). In addition, by storing information of a pet owner, record of preventive injection, and the like to a semiconductor device 1001 beforehand, a person who protects the pet which has run away can know how to handle the pet and can be relieved. As shown in FIG. 15B, the owner 1011 of the pet, a pet shop 1012, an animal hospital 1013, and the like may build a network for exchanging information in which a semiconductor device according to the present invention may be used as the semiconductor device 1001 which is carried by the pet as a means for communication based on the stored information. With such a network, if the owner 1011 is away for a long time and a pet is left in the pet shop 1012 and the pet gets sick, the animal hospital 1013 can know a record related to the pet easily, thereby a treatment for the pet can be conducted immediately.

Figure 16:
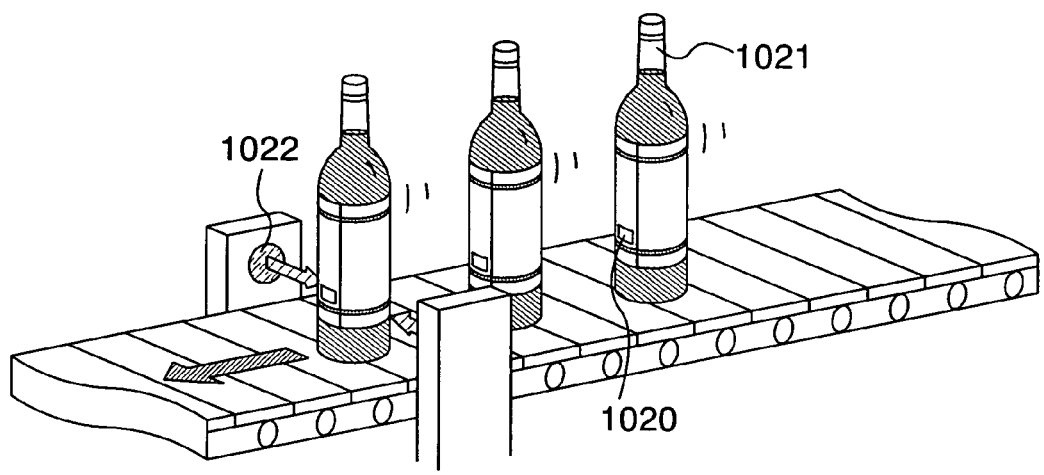
FIG. 16 is a diagram explaining an example of a use of a semiconductor device according to the present invention.

FIG. 16 shows an example in which a semiconductor device 1020 according to the present invention is mounted on a bottle 1021 for drinking water. In the semiconductor device 1020, information of the drinking water such as a manufacturing date, a manufacturer, and a raw material are stored by a reader/writer 1022.

A semiconductor device according to the present invention is manufactured with a high yield and provided at low-cost. Therefore, when it is used as explained above, the cost can be saved and is effective.

This application is based on Japanese Patent Application serial no. 2005-053103 filed in Japan Patent Office on 28th, Feb., 2005, the entire contents of which are hereby incorporated by reference.

What is claimed is:

1. A manufacturing method of a semiconductor device comprising:
    attaching a first flexible base material to a first side of an element layer,
    attaching a second flexible base material to a second side of the element layer,
    separating the first flexible base material from the element layer,
    attaching a third flexible base material which is thinner than the first flexible base material and the second flexible material to the first side of the element layer,
    separating the second flexible base material from the element layer to which the third flexible base material is attached, and
    attaching a fourth flexible base material which is thinner than the third flexible base material to the second side of the element layer.

2. The manufacturing method of a semiconductor device according to claim 1, wherein the second flexible base material is separated from the element layer while a fifth base material having a thickness of 100 to 200 μm is attached to the third flexible base material side of the element layer.

3. The manufacturing method of a semiconductor device according to claim 1, wherein each of the first flexible base material and the second flexible base material has a sticking layer whose adhesive strength is deteriorated by irradiation of light.

4. The manufacturing method of a semiconductor device according to claim 1, wherein each of the third flexible base material and the fourth flexible base material comprises an adhesive layer comprising a hot melt adhesive.

5. The manufacturing method of a semiconductor device according to claim 3, wherein the light is ultraviolet light.

6. The manufacturing method of a semiconductor device according to claim 1, wherein the element layer includes an insulating layer at the first side thereof and the element layer includes an insulating layer at the second side thereof.

7. A manufacturing method of a semiconductor device comprising:
    attaching a first flexible base material to a first side of an element layer,
    attaching a second flexible base material to a second side of the element layer, a thickness of the second flexible base material is same as that of the first flexible base material,
    separating the first flexible base material from the element layer,
    attaching a third flexible base material which is thinner than the first flexible base material to the first side of the element layer, separating the second flexible base material from the element layer to which the third flexible base material is attached, and attaching a fourth flexible base material to the second side of the element layer, a thickness of the fourth flexible base material is same as that of the third flexible base material.

8. The manufacturing method of a semiconductor device according to claim 7, wherein the second flexible base material is separated from the element layer while a fifth base material having a thickness of 100 to 200 μm is attached to the third flexible base material side of the element layer.

9. The manufacturing method of a semiconductor device according to claim 7, wherein each of the first flexible base material and the second flexible base material has a sticking layer whose adhesive strength is deteriorated by irradiation of light.

10. The manufacturing method of a semiconductor device according to claim 7, wherein each of the third flexible base material and the fourth flexible base material comprises an adhesive layer comprising a hot melt adhesive.

11. The manufacturing method of a semiconductor device according to claim 9, wherein the light is ultraviolet light.

12. The manufacturing method of a semiconductor device according to claim 7, wherein the element layer includes an insulating layer at the first side thereof and the element layer includes an insulating layer at the second side thereof.

* * * * *